US010657420B2

(12) United States Patent
Sha et al.

(10) Patent No.: US 10,657,420 B2
(45) Date of Patent: May 19, 2020

(54) MODELING POST-LITHOGRAPHY STOCHASTIC CRITICAL DIMENSION VARIATION WITH MULTI-TASK NEURAL NETWORKS

(71) Applicant: International Business Machines Corporation, Armonk, NY (US)

(72) Inventors: Jing Sha, White Plains, NY (US); Ekmini A. De Silva, Slingerlands, NY (US); Derren N. Dunn, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 16/037,454

(22) Filed: Jul. 17, 2018

(65) Prior Publication Data

US 2020/0026962 A1 Jan. 23, 2020

(51) Int. Cl.
| G06K 9/00 | (2006.01) |
| G06K 9/62 | (2006.01) |
| G06N 3/04 | (2006.01) |
| G06N 3/08 | (2006.01) |

(52) U.S. Cl.
CPC ......... *G06K 9/6262* (2013.01); *G06N 3/0454* (2013.01); *G06N 3/08* (2013.01)

(58) Field of Classification Search
None
See application file for complete search history.

(56) References Cited

U.S. PATENT DOCUMENTS

| 7,318,214 B1 | 1/2008 | Prasad et al. |
| 7,873,585 B2 | 1/2011 | Izikson |
| 8,745,545 B2 | 6/2014 | Yang et al. |
| 10,171,161 B1 * | 1/2019 | Cote ................. H04B 10/0793 |

(Continued)

FOREIGN PATENT DOCUMENTS

WO 2016086138 A1 6/2016

OTHER PUBLICATIONS

Shin et al., "Accurate lithography hotspot detection using deep convolutional neural networks", 2016 (Year: 2016).*
(Continued)

*Primary Examiner* — Soo Jin Park
(74) *Attorney, Agent, or Firm* — Vazken Alexanian; Ryan, Mason & Lewis, LLP

(57) ABSTRACT

A method of modeling distributions of post-lithography critical dimensions includes the following steps. A plurality of aerial images of respective portions of a physical design layout of a semiconductor wafer are generated, and the plurality of aerial images are employed as training data. In the method, first and second portions of a neural network architecture are generated. The first portion includes a neural network which is shared by a plurality of output channels, and the second portion includes a plurality of neural networks, wherein each of the plurality of neural networks respectively correspond to one of the plurality of output channels. The method further includes training the first and second portions of the neural network architecture with the training data, and outputting the distributions of the post-lithography critical dimensions based on the plurality of output channels.

25 Claims, 7 Drawing Sheets

(56) References Cited

U.S. PATENT DOCUMENTS

2005/0240895 A1   10/2005  Smith et al.
2017/0010538 A1    1/2017  Hansen

OTHER PUBLICATIONS

Y. Lin et al., "Data Efficient Lithography Modeling with Residual Neural Networks and Transfer Learning," Proceedings of the International Symposium on Physical Design (ISPD), Mar. 25-28, 2018, pp. 82-89.

T.A. Brunner et al., "Line-Edge Roughness Performance Targets for EUV Lithography," Proceedings of SPIE Extreme Ultraviolet (EUV) Lithography VIII, 2017, 10 pages.

Wikipedia, "Skew Normal Distribution," https://en.wikipedia.org/wiki/Skew_normal_distribution, Jun. 28, 2018, 5 pages.

Mark Lapedus, "EUV's New Problem Areas," Semiconductor Engineering, https://semiengineering.com/euvs-new-problem-areas/, Mar. 19, 2018, 15 pages.

Wikipedia, "Convolutional Neural Network," https://en.wikipedia.org/wiki/Convolution_neural_network, Jun. 19, 2018, 20 pages.

Dalong Zhao, "Design Process Technology Co-Optimization for Manufacturability," https://www.coventor.com/blog/dtco/, Sep. 21, 2016, 3 pages.

Ed Korczynski, "Edge Placement Error Control in Multi-Patterning," http://semimd.com/blog/2017/03/02/edge-placement-error-control-in-multi-patterning/, Mar. 2, 2017, 9 pages.

Mark Lapedus, "Patterning Problems Pile Up," https://semiengineering.com/patterning-problems-pile-up/, Mar. 20, 2017, 14 pages.

Synopsys.com, "Technology Computer Aided Design (TCAD)," https://www.synopsys.com/silicon/tcad.html, Downloaded Jul. 10, 2018, 5 pages.

Chris A. Mack, "Using the Normalized Image Log-Slope," The Lithography Expert, Winter 2001, 6 pages.

Y. Xu et al., "Demystifying Multitask Deep Neural Networks for Quantitative Structure—Activity Relationships," Journal of Chemical Information and Modeling, Sep. 5, 2017, pp. 2490-2504, vol. 57, No. 10.

R.L. Bristol et al. "Lithographic Stochastics: Beyond 3σ," Journal of Micro/Nanolithography, MEMS, and MOEMS, Jun. 12, 2017, 6 pages, vol. 16, No. 2.

Y. Watanabe et al., "Accurate Lithography Simulation Model Based on Convolutional Neural Networks," Proceedings of SPIE, Optical Microlithography, Mar. 30, 2017, 9 pages, vol. 10147.

D. Civay et al., "Deconstructing Contact Hole CD Printing Variability in EUV Lithography," Proceedings of SPIE, Extreme Ultraviolet (EUV) Lithography, Apr. 27, 2014, 17 pages, vol. 9048.

\* cited by examiner

MODELING POST-LITHOGRAPHY STOCHASTIC CRITICAL DIMENSION VARIATION WITH MULTI-TASK NEURAL NETWORKS

BACKGROUND

In advanced patterning, such as, for example, patterning beyond 7 nm node using extreme ultra-violet (EUV) lithography, stochastic effects play a major role in total edge placement error (EPE). Stochastic effects are generally the result of events having random variables. For example, in the case of EUV, photon reactions with photoresists may vary with respective interactions of EUV light with the photoresists, causing variations in the design of a semiconductor device. For example, EPE refers to differences between intended and printed features of an integrated circuit (IC).

Technology computer aided design (TCAD) refers to the use of computer simulations to model and optimize semiconductor fabrication technologies and device operation. The electronic design automation that models fabrication has been referred to as process TCAD, the electronic design automation that models device operation has been referred to as device TCAD.

Understanding and accurate modeling of stochastic EPE (SEPE) is crucial to process control and failure analysis in semiconductor manufacturing. It is, therefore, important to accurately model developed critical dimension (DCD) distribution at the full-chip level. Current simulation solutions utilize production software which uses one model for critical dimension (CD) mean, and another separate empirical model for SEPE.

The conventional simulation models incorrectly assume a symmetrical distribution of CD, which has been proven not to be true, and three standard deviations ($3\sigma$) of CD mean depend only on dose sensitivity ($ILS^{-1}$) or blurred ILS, which is an oversimplified empirical model. Further, simulation with physical models using commercially available software is computationally expensive and cannot be scaled to predict full-chip level CD deviation and thus yield.

Accordingly, there is a need for improved TCAD for semiconductor processing simulations, which addresses the above limitations.

SUMMARY

According to an exemplary embodiment of the present invention, a method of modeling distributions of post-lithography critical dimensions includes the following steps. A plurality of aerial images of respective portions of a physical design layout of a semiconductor wafer are generated, and the plurality of aerial images are employed as training data. In the method, first and second portions of a neural network architecture are generated. The first portion includes a neural network which is shared by a plurality of output channels, and the second portion includes a plurality of neural networks, wherein each of the plurality of neural networks respectively correspond to one of the plurality of output channels. The method further includes training the first and second portions of the neural network architecture with the training data, and outputting the distributions of the post-lithography critical dimensions based on the plurality of output channels.

According to an exemplary embodiment of the present invention, a system for modeling distributions of post-lithography critical dimensions includes a memory and at least one processor coupled to the memory, wherein the at least one processor is configured to generate a plurality of aerial images of respective portions of a physical design layout of a semiconductor wafer, and employ the plurality of aerial images as training data. The processor is further configured to generate first and second portions of a neural network architecture. The first portion includes a neural network which is shared by a plurality of output channels, and the second portion includes a plurality of neural networks, wherein each of the plurality of neural networks respectively correspond to one of the plurality of output channels. The processor is also configured to train the first and second portions of the neural network architecture with the training data, and output the distributions of the post-lithography critical dimensions based on the plurality of output channels.

According to an exemplary embodiment of the present invention, a computer program product for modeling distributions of post-lithography critical dimensions includes a computer readable storage medium having program instructions embodied therewith, the program instructions executable by a processor to cause the processor to perform a method comprising generating a plurality of aerial images of respective portions of a physical design layout of a semiconductor wafer, and employing the plurality of aerial images as training data. In the method, first and second portions of a neural network architecture are generated. The first portion includes a neural network which is shared by a plurality of output channels, and the second portion includes a plurality of neural networks, wherein each of the plurality of neural networks respectively correspond to one of the plurality of output channels. The method further includes training the first and second portions of the neural network architecture with the training data, and outputting the distributions of the post-lithography critical dimensions based on the plurality of output channels.

According to an exemplary embodiment of the present invention, a method of modeling distributions of critical dimensions includes receiving as inputs a plurality of aerial images of respective portions of a physical design layout of a semiconductor wafer, and employing the plurality of aerial images as training data. In the method, a first neural network and a plurality of second neural networks are generated. The first neural network is shared by at least three output channels, and the plurality of second neural networks respectively correspond to each one of the at least three output channels. The method further includes training the first and second neural networks with the training data, and outputting the distributions of the critical dimensions based on the at least three output channels.

According to an exemplary embodiment of the present invention, a method of modeling distributions of critical dimensions includes receiving as inputs a plurality of aerial images of respective portions of a physical design layout of a semiconductor wafer, employing the plurality of aerial images as training data. In the method, a first neural network and a plurality of second neural networks are generated. The first neural network is shared by at least three parameters of the distributions of the critical dimensions, and the distributions are asymmetric. The plurality of second neural networks respectively correspond to each one of the at least three parameters. The method further includes training the first and second neural networks with the training data, and outputting the distributions of the critical dimensions based on the at least three parameters.

These and other illustrative embodiments include, without limitation, apparatuses, systems, methods and computer program products comprising computer readable storage media.

These and other illustrative embodiments of the invention will be described in or become apparent from the following detailed description of exemplary embodiments, which is to be read in connection with the accompanying drawings.

DETAILED DESCRIPTION

Illustrative embodiments will be described below for using multi-task neural networks for co-modeling critical dimension (CD) mean and SEPE.

As used herein, "critical dimension (CD)" refers to the size of a feature on an integrated circuit, semiconductor wafer or semiconductor device that impacts the electrical properties of the device.

As used herein, "developed CD (DCD)" refers to a type of CD. More specifically, DCDs refer to critical dimensions of developed or post-lithography photoresist patterns.

In one example embodiment, developed CD (DCD) is modeled as an asymmetric distribution using more than two parameters simultaneously, rather than as a symmetric distribution, which is described by two parameters. Consequently, embodiments of the present invention employ multi-task neural networks in TCAD computer simulations to model asymmetric DCD distribution parameters concurrently for more robust lithography simulation models, than when using conventional methods based on symmetrical CD distributions.

More particularly, illustrative embodiments provide methods and systems which generate DCD distributions for layout patterns based on several parameters (e.g., DCD average, standard deviation (also referred to herein as "variance"), skewness, etc.), which are also correlated. For example, according to one or more embodiments of the present invention, multi-task neural networks model DCD mean and DCD stochastic variation simultaneously for more robust modeling accuracy than previous TCAD computer simulations.

Thus, illustrative embodiments address the issue of asymmetric CD distribution, and of SEPE bands not being symmetrical across nominal CDs, which current commercial TCAD computer simulation models fail to address. Representing SEPE bands as ±3σ (three standard deviations) is not accurate and can lead to overoptimistic evaluations.

Advantageously, illustrative embodiments provide efficient single-step simultaneous modeling/simulation of both DCD mean and DCD stochastic variation. The multi-task computer simulation models make better predictions than single-task models when targets are correlated, and the neural networks used in the models are flexible so that they can be fine-tuned on a case-by-case basis. Moreover, as an advantage over current technology, the multi-task models of the embodiments of the present invention are scalable. In other words, the trained model can be applied to full-chip layouts to provide post-lithography CD distributions on a full-chip level, which is not possible with current simulations.

Figure 1:
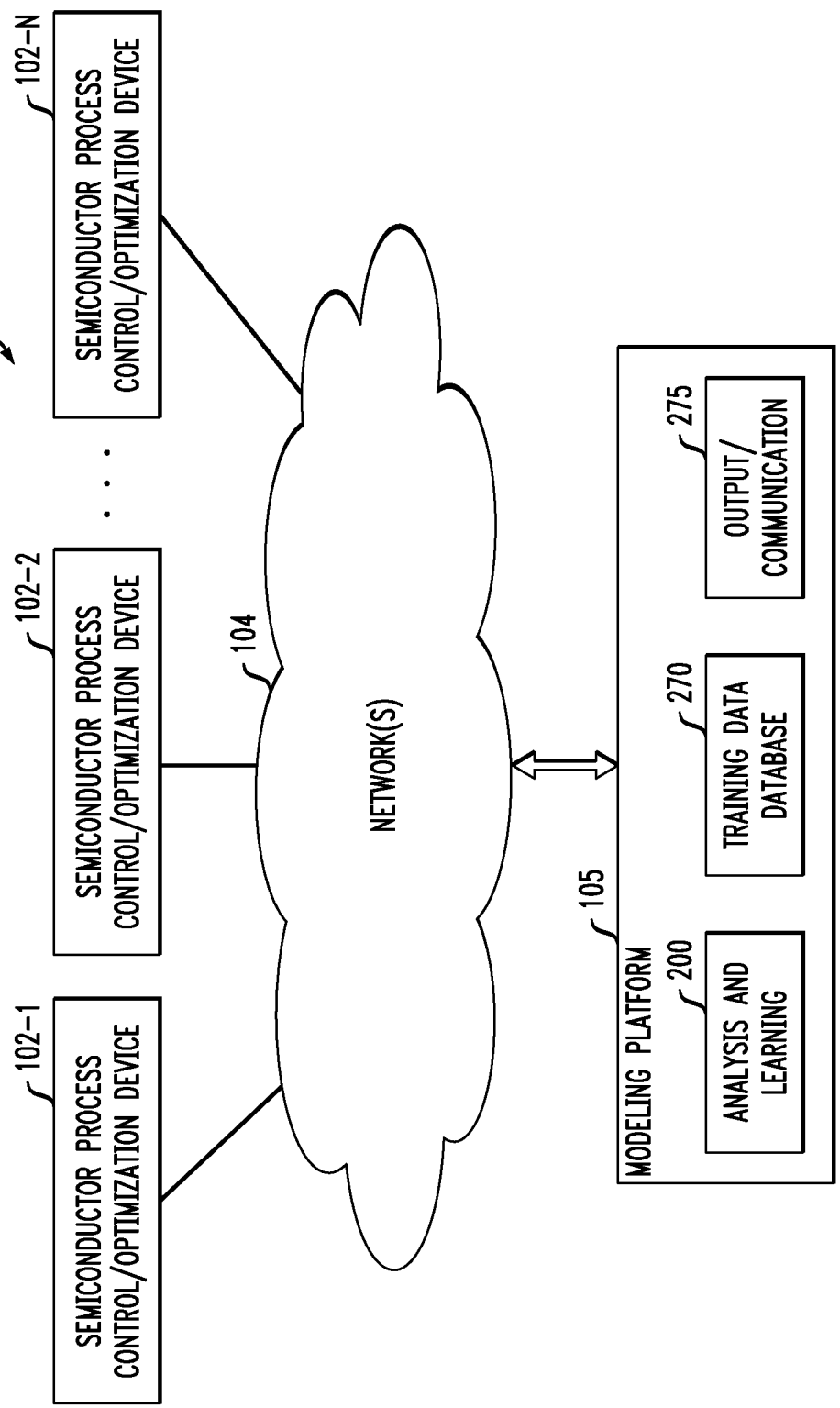
FIG. 1 is a block diagram of an information processing system including a modeling platform configured for modeling critical dimension distribution with multi-task neural networks according to one or more embodiments of the invention.

FIG. 1 is a block diagram of a system including a modeling platform configured for modeling critical dimension distribution with multi-task neural networks according to one or more embodiments of the invention. As shown in FIG. 1 by lines and/or arrows, the components of the system 100 are operatively connected to each other via, for example, physical connections, such as wired and/or direct electrical contact connections, and/or wireless connections, such as, for example, WiFi, BLUETOOTH, IEEE 802.11, and/or networks, including but not limited to, a local area network (LAN), wide area network (WAN), cellular network, ad hoc networks, WANET, satellite network or the Internet. For example, a network 104 can operatively link one or more components 102-1, 102-2, . . . , 102-N and 105 of the system 100.

By way of non-limiting example, in accordance with an embodiment of the present invention, referring to FIG. 1, the system 100 includes semiconductor process control/optimization devices 102-1, 102-2, . . . 102-N (collectively "control/optimization devices 102). The variable N and other similar variables herein such as K and M are integers greater than one. The control/optimization devices 102 communicate over the network 104 with a modeling platform 105.

The control/optimization devices 102 can comprise, for example, computers, semiconductor fabrication, manufacturing, processing and/or design devices associated with, for example, process control and/or design-technology co-optimization (DTCO), or other types of semiconductor processing devices capable of communicating with the modeling platform 105 over the network 104. Post-lithography CD distribution modeling/simulation outputs from the modeling platform 105 provided to the control/optimization devices 102 are used and processed by the control/optimization devices 102 to improve and/or optimize semiconductor fabrication processes and the design thereof to minimize stochastic effects of the semiconductor manufacturing processes. The outputs from the modeling platform 105 are communicated to the control/optimization devices 102 via, for example, network(s) 104 and an output/communication component 275 of the modeling platform 105.

CD distribution has been numerically and experimentally proven as an asymmetric distribution. For example, in semiconductor fabrication CD data, asymmetric tails of undersized vias (e.g., contact vias) appear clearly as deviations from the normal distribution. The asymmetric tails in the CD distribution are critical to yield, especially of the vias.

Stochastic effect models in connection with embodiments of the present invention are based on a description of CD distribution which uses a skewed normal distribution. The skewed normal distribution is a continuous probability distribution that generalizes a normal distribution to allow for non-zero skewness. For example, a symmetric normal distribution is based on a zero skewness ($\alpha=0$), and 2 parameters ($\xi$, $\omega$) to describe the distribution (e.g., CD mean=$\xi$ and CD variance=$\omega^2$). In contrast, an asymmetric normal distribution is based on a non-zero skewness ($\alpha \neq 0$), and 3 parameters ($\xi$, $\omega$, $\alpha$) to describe the distribution (e.g., CD mean=$\xi$, CD variance=$\omega^2$ and skewness=$\alpha$).

Figure 2:
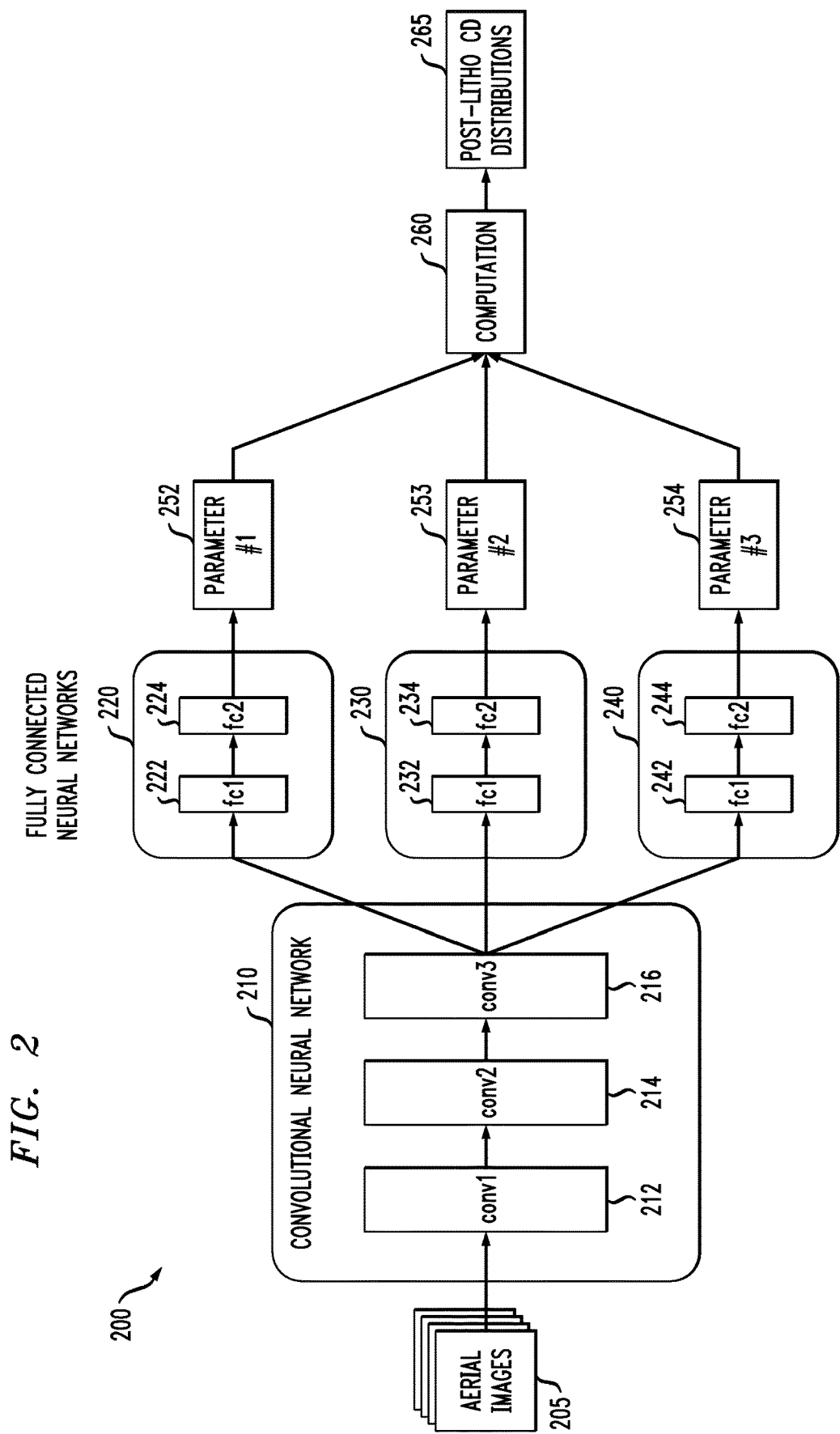
FIG. 2 illustrates a workflow of training and later inferencing the modeling platform described in connection with FIG. 1 according to one or more embodiments of the invention.

The modeling platform 105 includes an analysis and learning engine 200, a training data database 270 and the output/communication module 275. Referring to FIG. 2, according to one or more embodiments of the invention, the analysis and learning engine 200 includes a neural network 210 which is shared by a plurality of output channels 252, 253 and 254, representing 3 parameters (e.g., co, a). The embodiments of the present invention are not necessarily limited to these three parameters or three parameters in general, and may apply to different parameters, and more than three parameters.

According to an embodiment of the present invention, the neural network 210 is a convolutional neural network (CNN) including a plurality of convolutional neural network layers 212, 214 and 216 (conv1, conv2 and conv3), or hidden layers. The number of hidden layers is not necessarily limited to three, and may be varied for better model training on a case-by-case basis. Additional hidden layers of the CNN 210 can include, for example, pooling layers and normalization layers. The CNN 210 could be replaced with different neural network architectures as long as they can extract sufficient features from the input.

Each convolutional layer 212, 214 and 216 applies a convolution operation to the input (described further herein below), passing the result to the next layer. The CNN 210 may include pooling layers, which can combine the outputs of neuron clusters in one layer into a single neuron in a next layer.

The analysis and learning engine 200 further includes a plurality of neural networks 220, 230 and 240 connected to outputs of the neural network 210. Each of the plurality of neural networks 220, 230 and 240 respectively corresponds to one of the plurality of output channels 252, 253 or 254. For example, neural network 220 corresponds to output channel 252 and a first parameter, neural network 230 corresponds to output channel 253 and a second parameter, and neural network 240 corresponds to output channel 254 and a third parameter. To the extent that there are a different number of output channels (and parameters), the number of the plurality of neural networks like the neural networks 220, 230 and 240 may vary to respectively correspond to the number of the output channels. In the case of an asymmetric distribution, the number of output channels, which is equal to the number of parameters, is at least three.

According to an embodiment of the present invention, each of the neural networks 220, 230 and 240 is a fully connected neural network including a plurality of fully connected layers. For example, fully connected neural network 220 includes fully connected layers 222 and 224, fully connected neural network 230 includes fully connected layers 232 and 234, and fully connected neural network 240 includes fully connected layers 242 and 244. Fully connected layers connect every neuron in one layer to every neuron in another layer. The three separate fully connected neural networks 220, 230 and 240 can have a different number of fully connected layers (i.e., hidden layers) as needed.

Figure 3:
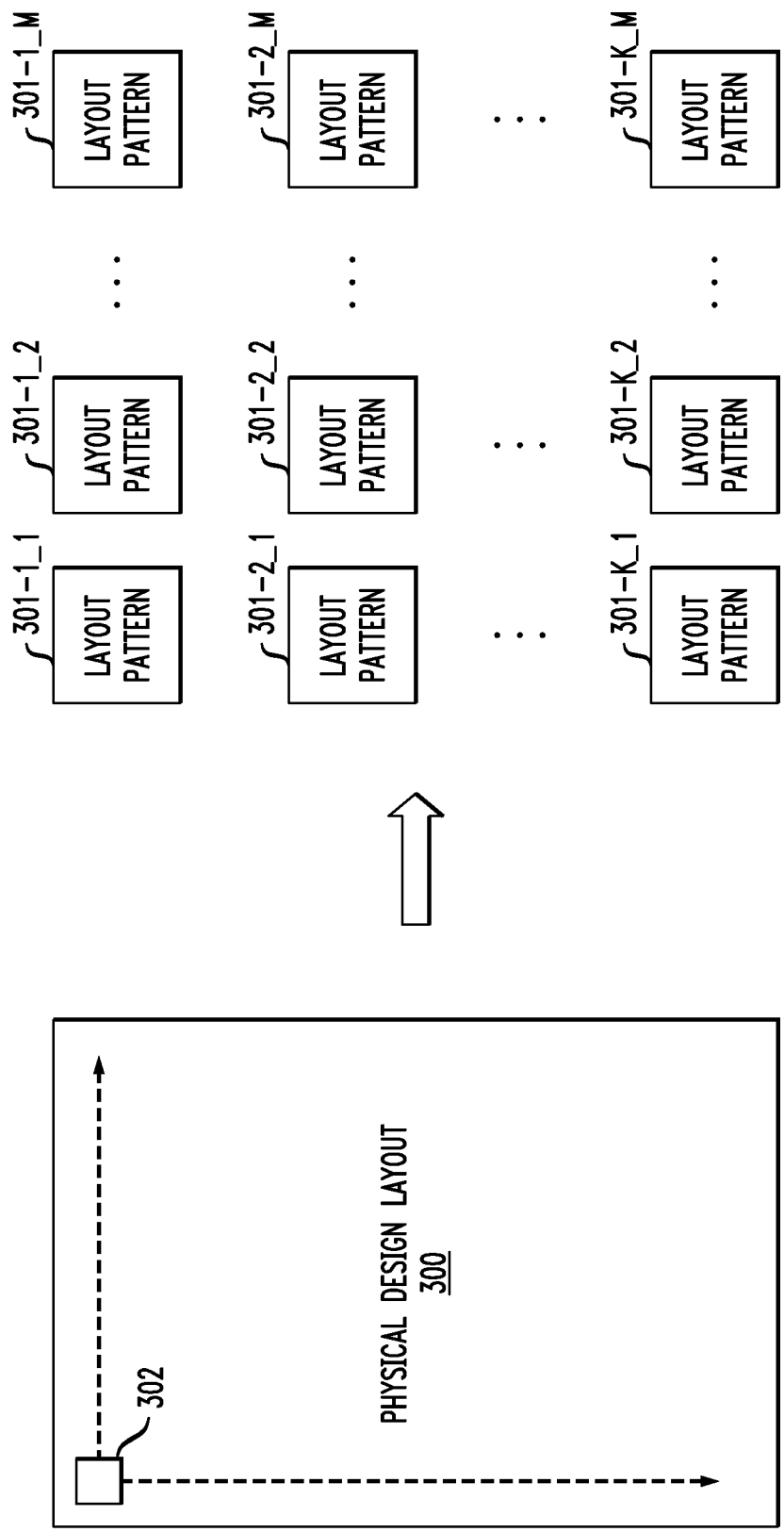
FIG. 3 illustrates how layout patterns are prepared from a physical design layout for optical simulation according to one or more embodiments of the invention.

FIG. 3 illustrates capture of layout patterns from a physical design layout 300. FIG. 3 shows a top-down view of a physical design layout 300, as well as a number of physical design layout patterns 301 captured therefrom. The physical design layout patterns 301 are captured (e.g., clipped out) at different locations of the physical design layout 300 in a field of view (FOV) 302. As shown, there are K rows and M columns of physical design layout patterns 301 captured (e.g., clipped) from the physical design layout 300. For example, FIG. 3 illustrates a physical design layout 300 and layout patterns 301-1_1, 301-1_2, . . . 301-1_M in a horizontal direction, layout patterns 301-1_1, 301-2_1, . . . 302-K_1 in a vertical direction, and layout patterns 301-1_1 . . . 301-K_M in horizontal and vertical directions (collectively "layout patterns 301"). Aerial images are projected images or light intensity distributions at the photolithography step and can be represented in terms of image space parameters such as, for example, $I_{max}$, $I_{min}$, and other derivatives of light intensity (I). The aerial images 205 are optical simulation results of the layout patterns 301 respectively.

The aerial images 205 (shown in FIG. 2) are employed as training data for the neural networks 210, 220, 230 and 240, and can be stored in a training data database 270. The neural networks 210, 220, 230 and 240 are trained with the training data.

The CD (e.g., DCD) distributions for each layout pattern or aerial image can be described by several parameters 252, 253 and 254 (e.g., DCD average, standard deviation, skewness, etc.), which are also correlated, and the distributions of the post-lithography critical dimensions 265, which are based on the plurality of parameters 252, 253 and 254 are output. A computation component 260 processes the outputted asymmetric distribution parameters 252, 253 and 254 to generate the post-lithography CD distributions 265. The post-lithography CD distributions 265 include asymmetric tails deviating from the normal distribution. The post-lithography CD distributions 265 (e.g., DCD distributions) are generated as a result of the simultaneous modeling of different parameters 252, 253 and 254 using the combination of the neural networks 210, 220, 230 and 240. The post-lithography CD distributions 265 are transmitted to the control/optimization devices 102, which use the post-lithography CD distributions 265 to improve and/or optimize semiconductor fabrication processes and the design thereof to minimize stochastic effects of the semiconductor manufacturing processes. For example, the post-lithography CD distributions 265 are used to predict stochastic effects of EUV lithography.

Hyperparameters of the neural networks 210, 220, 230 and 240 are fine-tuned to improve modeling accuracy (e.g., matching simulated CDs to measured CDs (or wafer CDs by metrology on real patterned wafers). The trained neural networks 210, 220, 230 and 240 are scalable and can be applied to full-chip modeling of the distributions of the post-lithography critical dimensions.

Figure 4:
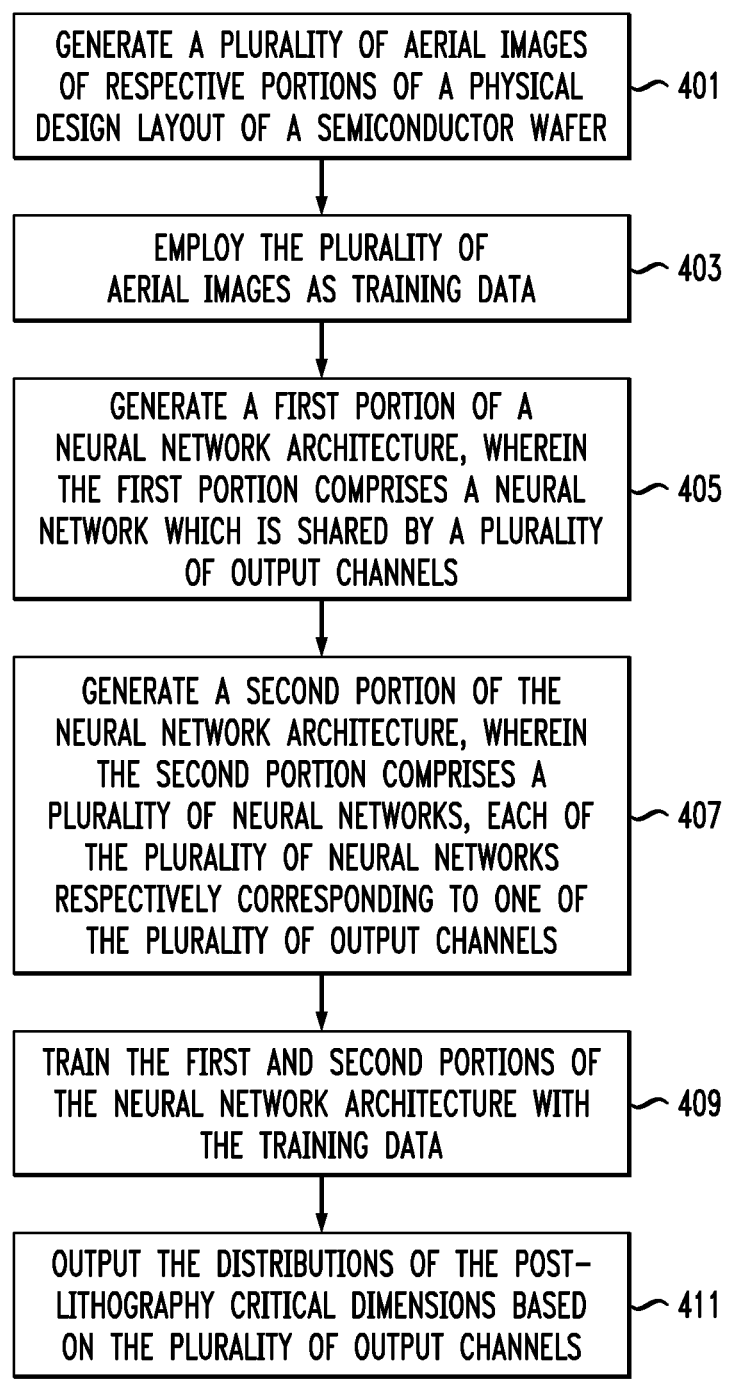
FIG. 4 illustrates a methodology for modeling critical dimension distribution with multi-task neural networks according to one or more embodiments of the invention.

FIG. 4 illustrates a methodology for modeling critical dimension distribution with multi-task neural networks according to one or more embodiments of the invention. Referring to FIG. 4, the methodology 400 includes, at blocks 401 and 403 respectively, generating a plurality of aerial images of respective portions of a physical design layout of a semiconductor wafer, and employing the plurality of aerial images as training data. The plurality of aerial images each include a distribution of light intensity as a function of position. The respective portions of the physical design layout of the semiconductor wafer can include respective layout patterns from different locations of the physical design layout.

The methodology 400 also includes at blocks 405 and 407 respectively, generating first and second portions of a neural network architecture. The first portion includes a neural network which is shared by a plurality of output channels, and can be, for example, a convolutional neural network. The second portion includes a plurality of neural networks, wherein each of the plurality of neural networks respectively correspond to one of the plurality of output channels. According to an embodiment, each of the plurality of neural networks of the second portion of the neural network architecture comprises a fully connected neural network. The convolutional and fully connected neural networks may each include a plurality of hidden layers.

Referring to blocks 409 and 411, respectively, of the methodology 400, the first and second portions of the neural network architecture are trained with the training data, and the distributions of the post-lithography critical dimensions based on the plurality of output channels are outputted. The distributions of the post-lithography critical dimensions are asymmetric.

In accordance with one or more embodiments of the present invention, there are at least three output channels respectively corresponding to different parameters of the distributions of the post-lithography critical dimensions, wherein the distributions are asymmetric. For example, the different parameters include critical dimension mean, critical dimension variation, and critical dimension skewness. The methodology includes simultaneously modeling/simulating the different parameters using the first and second portions of the neural network architecture.

In accordance with one or more embodiments of the present invention, the plurality of output channels respectively include at least critical dimension mean and critical dimension stochastic variation, which are simultaneously modeled using the first and second portions of the neural network architecture.

The methodology further includes fine-tuning hyperparameters of the first and second portions of the neural network architecture, analyzing stochastic effect of EUV lithography with the outputted distributions of the post-lithography critical dimensions, and applying the trained first and second portions of the neural network architecture to full-chip modeling of the distributions of the post-lithography critical dimensions.

Accordingly, as described herein, one or more illustrative embodiments advantageously utilize multi-task neural network models, which apply a neural network model to multiple activities (i.e., targets), instead of single-task models, which use a neural network model for each individual activity (i.e., target). Multi-task models make more accurate predictions than single-task models when the activities (targets) are correlated.

In one or more embodiments of the present invention, CD mean and CD deviation are correlated and modeled simultaneously for improved accuracy over conventional computer simulation techniques. For example, in accordance with one or more embodiment of the present invention, three parameters (mean, standard deviation (variance), and skewness) are simultaneously modeled using a multi-task neural network model to describe CD distribution, which provided more accurate results over conventional computer simulation techniques.

Figure 5:
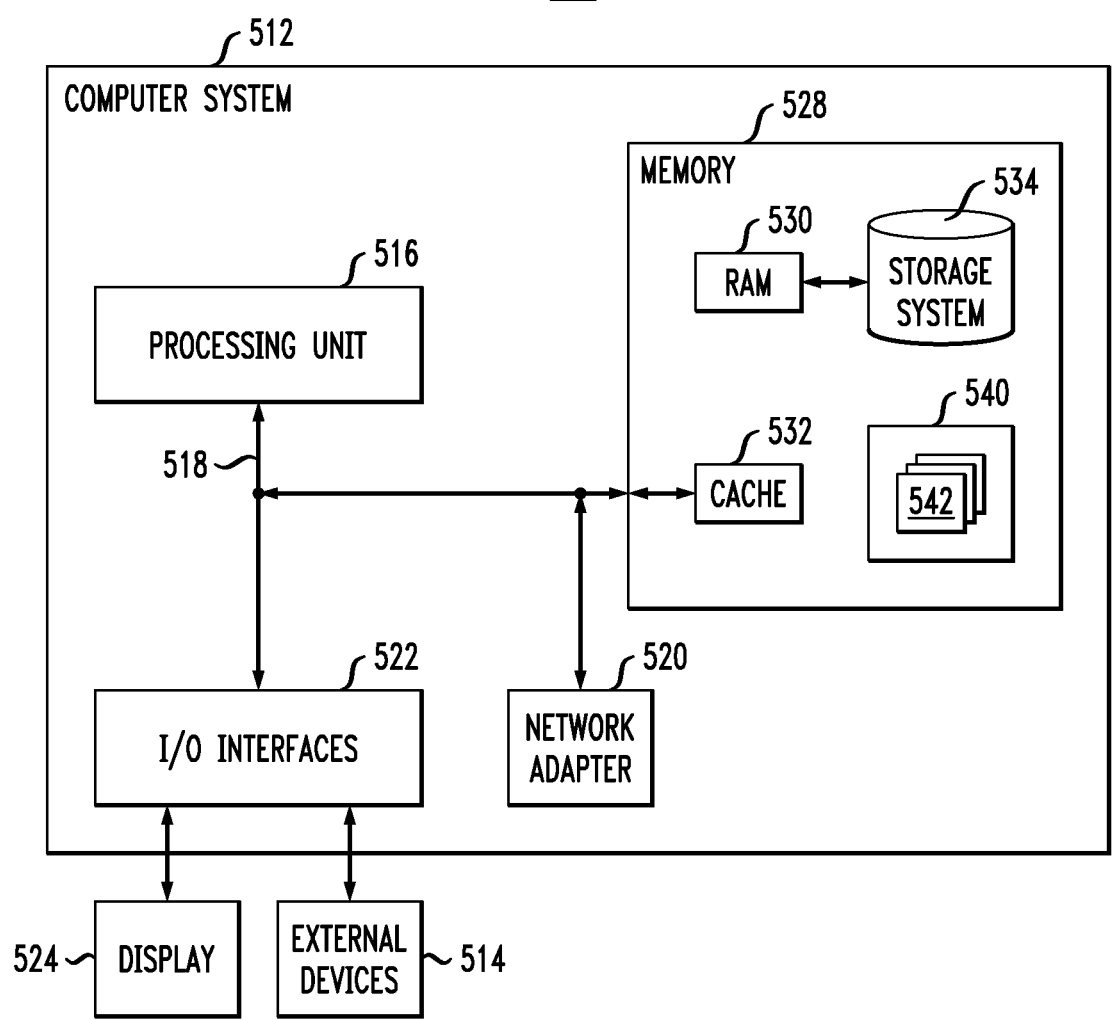
FIG. 5 depicts a computer system in accordance with which one or more components/steps of techniques of the invention may be implemented according to one or more embodiments of the invention.

One or more embodiments can make use of software running on a computer or workstation. With reference to FIG. 5, in a computing node 510 there is a system/server 512, which is operational with numerous other general purpose or special purpose computing system environments or configurations. Examples of well-known computing systems, environments, and/or configurations that may be suitable for use with system/server 512 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Each computing node in the computing platform 100 can implement the architecture shown in computing node 510.

System/server 512 may be described in the general context of computer system executable instructions, such as program modules, being executed by a computer system. Generally, program modules may include routines, programs, objects, components, logic, data structures, and so on that perform particular tasks or implement particular abstract data types. System/server 512 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 5, system/server 512 is shown in the form of a computing device. The components of system/server 512 may include, but are not limited to, one or more processors or processing units 516, system memory 528, and bus 518 that couples various system components including system memory 528 to processor 516.

Bus 518 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

System/server 512 typically includes a variety of computer system readable media. Such media may be any available media that is accessible by system/server 512, and it includes both volatile and non-volatile media, removable and non-removable media.

The system memory 528 can include computer system readable media in the form of volatile memory, such as random-access memory (RAM) 530 and/or cache memory 532. System/server 512 may further include other removable/non-removable, volatile/nonvolatile computer system storage media. By way of example only, storage system 534 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 518 by one or more data media interfaces.

As depicted and described herein, memory 528 may include at least one program product having a set (e.g., at least one) of program modules that are configured to carry out the functions of embodiments of the invention. A program/utility 540, having a set (at least one) of program modules 542, may be stored in memory 528 by way of example, and not limitation, as well as an operating system, one or more application programs, other program modules, and program data. Each of the operating system, one or more application programs, other program modules, and program data or some combination thereof, may include an implementation of a networking environment. Program modules 542 generally carry out the functions and/or methodologies of embodiments of the invention as described herein.

System/server 512 may also communicate with one or more external devices 514 such as a keyboard, a pointing device, an external data storage device (e.g., a USB drive), display 524, one or more devices that enable a user to interact with system/server 512, and/or any devices (e.g., network card, modem, etc.) that enable system/server 512 to communicate with one or more other computing devices. Such communication can occur via I/O interfaces 522. Still yet, system/server 512 can communicate with one or more networks such as a LAN, a general WAN, and/or a public network (e.g., the Internet) via network adapter 520. As depicted, network adapter 520 communicates with the other components of system/server 512 via bus 518. It should be understood that although not shown, other hardware and/or software components could be used in conjunction with system/server 512. Examples include, but are not limited to, microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 6:
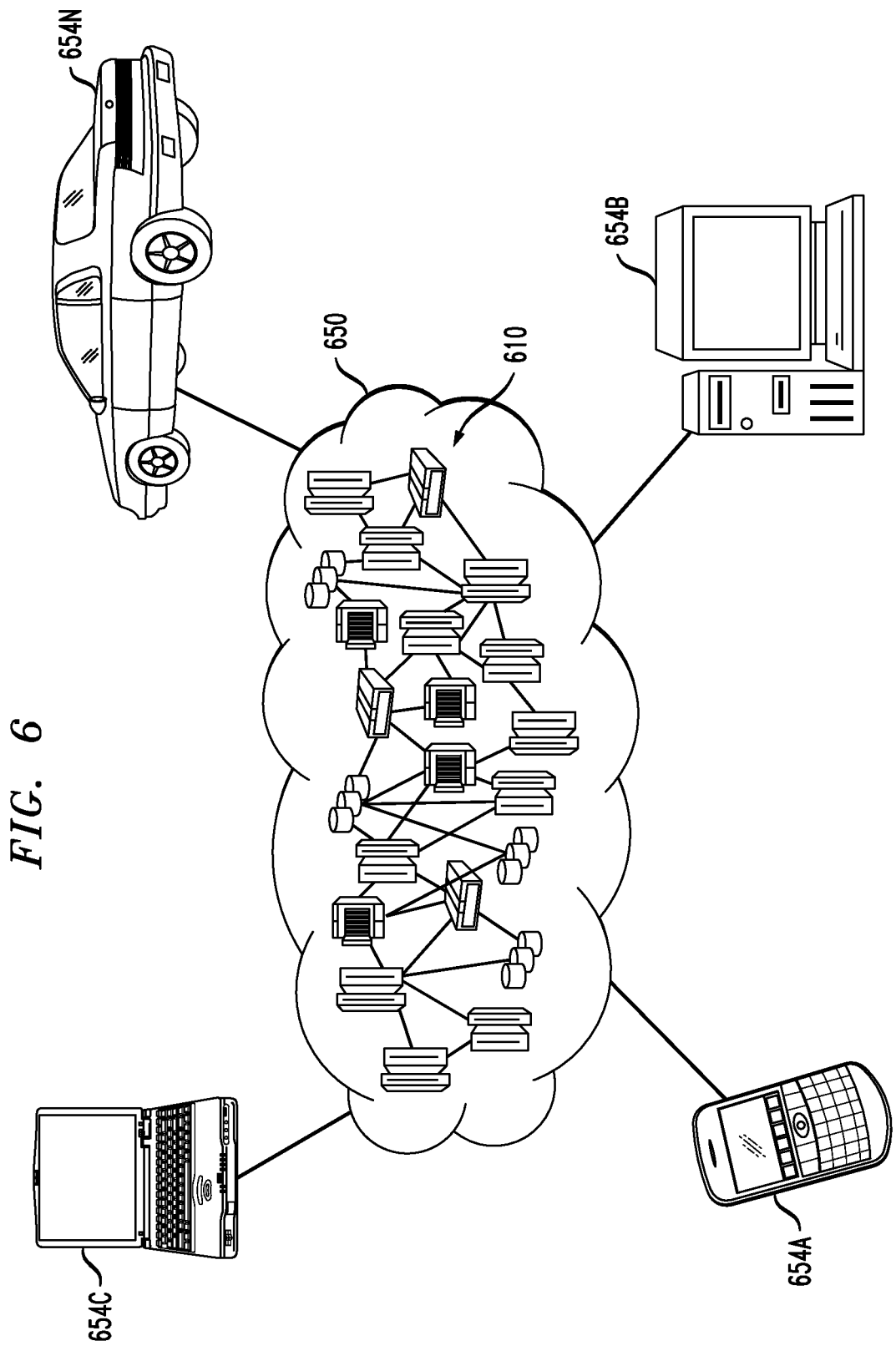
FIG. 6 depicts a cloud computing environment according to one or more embodiments of the invention.

Referring now to FIG. 6, illustrative cloud computing environment 650 is depicted. As shown, cloud computing environment 650 includes one or more cloud computing nodes 610 with which local computing devices used by cloud consumers, such as, for example, personal digital assistant (PDA) or cellular telephone 654A, desktop computer 654B, laptop computer 654C, and/or automobile computer system 654N may communicate. Nodes 610 may communicate with one another. They may be grouped (not shown) physically or virtually, in one or more networks, such as Private, Community, Public, or Hybrid clouds as described hereinabove, or a combination thereof. This allows cloud computing environment 650 to offer infrastructure, platforms and/or software as services for which a cloud consumer does not need to maintain resources on a local computing device. It is understood that the types of computing devices 654A-N shown in FIG. 6 are intended to be illustrative only and that computing nodes 610 and cloud computing environment 650 can communicate with any type of computerized device over any type of network and/or network addressable connection (e.g., using a web browser).

Figure 7:
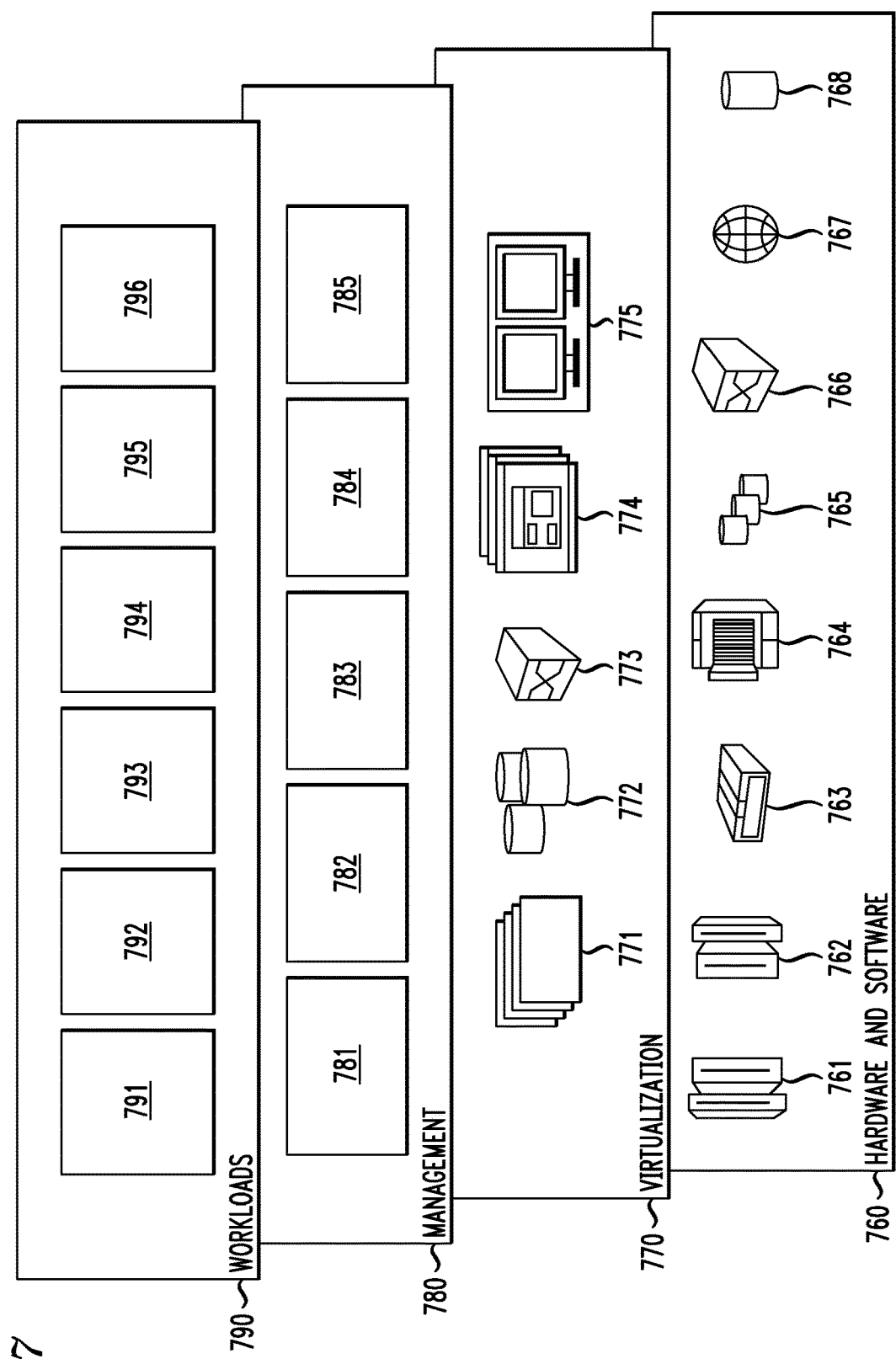
FIG. 7 depicts abstraction model layers according to one or more embodiments of the invention.

Referring now to FIG. 7, a set of functional abstraction layers provided by cloud computing environment 650 (FIG. 6) is shown. It should be understood in advance that the components, layers, and functions shown in FIG. 7 are intended to be illustrative only and embodiments of the invention are not limited thereto. As depicted, the following layers and corresponding functions are provided:

Hardware and software layer 760 includes hardware and software components. Examples of hardware components include: mainframes 761; RISC (Reduced Instruction Set Computer) architecture-based servers 762; servers 763; blade servers 764; storage devices 765; and networks and networking components 766. In some embodiments, software components include network application server software 767 and database software 768.

Virtualization layer 770 provides an abstraction layer from which the following examples of virtual entities may be provided: virtual servers 771; virtual storage 772; virtual networks 773, including virtual private networks; virtual applications and operating systems 774; and virtual clients 775.

In one example, management layer 780 may provide the functions described below. Resource provisioning 781 provides dynamic procurement of computing resources and other resources that are utilized to perform tasks within the cloud computing environment. Metering and Pricing 782 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 783 provides access to the cloud computing environment for consumers and system administrators. Service level management 784 provides cloud computing resource allocation and management such that required service levels are met. Service Level Agreement (SLA) planning and fulfillment 785 provide pre-arrangement for, and procurement of, cloud computing resources for which a future requirement is anticipated in accordance with an SLA.

Workloads layer 790 provides examples of functionality for which the cloud computing environment may be utilized. Examples of workloads and functions which may be provided from this layer include: mapping and navigation 791; software development and lifecycle management 792; virtual classroom education delivery 793; data analytics processing 794; transaction processing 795; and post-lithography critical dimension simulation processing 796, which may perform various functions described above.

Embodiments of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Embodiments of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of modeling distributions of post-lithography critical dimensions, comprising:
    generating a plurality of aerial images of respective portions of a physical design layout of a semiconductor wafer;
    employing the plurality of aerial images as training data;
    generating a first portion of a neural network architecture, wherein the first portion comprises a neural network which is shared by a plurality of output channels;
    generating a second portion of the neural network architecture, wherein the second portion comprises a plurality of neural networks, each of the plurality of neural networks respectively corresponding to one of the plurality of output channels;
    training the first and second portions of the neural network architecture with the training data; and
    outputting the distributions of the post-lithography critical dimensions based on the plurality of output channels;
    wherein the method is performed by at least one computer system comprising at least one memory and at least one processor coupled to the memory.

2. The method according to claim 1, wherein the first portion of the neural network architecture comprises a convolutional neural network.

3. The method according to claim 1, wherein each of the plurality of neural networks of the second portion of the neural network architecture comprises a fully connected neural network.

4. The method according to claim 3, wherein each of the plurality of neural networks of the second portion comprises a plurality of hidden layers.

5. The method according to claim 1, wherein the plurality of output channels comprise at least three output channels.

6. The method according to claim 1, wherein the plurality of output channels respectively comprise different parameters of the distributions of the post-lithography critical dimensions, wherein the distributions are asymmetric.

7. The method according to claim 6, wherein the different parameters comprise critical dimension mean, critical dimension variation, and critical dimension skewness.

8. The method according to claim 6, further comprising simultaneously modeling the different parameters using the first and second portions of the neural network architecture.

9. The method according to claim 1, wherein the plurality of output channels respectively comprise at least critical dimension mean and critical dimension stochastic variation, and the method further comprises simultaneously modeling the critical dimension mean and the critical dimension stochastic variation using the first and second portions of the neural network architecture.

10. The method according to claim 1, wherein the distributions of the post-lithography critical dimensions are asymmetric.

11. The method according to claim 1, further comprising fine-tuning hyperparameters of the first and second portions of the neural network architecture.

12. The method according to claim 1, wherein the plurality of aerial images comprise a distribution of light intensity as a function of position.

13. The method according to claim 1, wherein the respective portions of the physical design layout of the semiconductor wafer comprise respective layout patterns from different locations of the physical design layout.

14. The method of claim 1, further comprising analyzing stochastic effect of EUV lithography with the outputted distributions of the post-lithography critical dimensions.

15. The method of claim 1, further comprising applying the trained first and second portions of the neural network architecture to full-chip modeling of the distributions of the post-lithography critical dimensions.

16. A system for modeling distributions of post-lithography critical dimensions, comprising:
a memory and at least one processor coupled to the memory, wherein the at least one processor is configured to:
generate a plurality of aerial images of respective portions of a physical design layout of a semiconductor wafer;
employ the plurality of aerial images as training data;
generate a first portion of a neural network architecture, wherein the first portion comprises a neural network which is shared by a plurality of output channels;
generate a second portion of the neural network architecture, wherein the second portion comprises a plurality of neural networks, each of the plurality of neural networks respectively corresponding to one of the plurality of output channels;
train the first and second portions of the neural network architecture with the training data; and
output the distributions of the post-lithography critical dimensions based on the plurality of output channels.

17. The system according to claim 16, wherein the first portion of the neural network architecture comprises a convolutional neural network.

18. The system according to claim 16, each of the plurality of neural networks of the second portion of the neural network architecture comprises a fully connected neural network.

19. The system according to claim 16, wherein the plurality of output channels respectively comprise different parameters of the distributions of the post-lithography critical dimensions, wherein the distributions are asymmetric.

20. A computer program product for modeling distributions of post-lithography critical dimensions, the computer program product comprising a computer readable storage medium having program instructions embodied therewith, the program instructions executable by a processor to cause the processor to perform a method comprising:
generating a plurality of aerial images of respective portions of a physical design layout of a semiconductor wafer;
employing the plurality of aerial images as training data;
generating a first portion of a neural network architecture, wherein the first portion comprises a neural network which is shared by a plurality of output channels;
generating a second portion of the neural network architecture, wherein the second portion comprises a plurality of neural networks, each of the plurality of neural networks respectively corresponding to one of the plurality of output channels;
training the first and second portions of the neural network architecture with the training data; and
outputting the distributions of the post-lithography critical dimensions based on the plurality of output channels.

21. A method of modeling distributions of critical dimensions, comprising:
receiving as inputs a plurality of aerial images of respective portions of a physical design layout of a semiconductor wafer;
employing the plurality of aerial images as training data;
generating a first neural network which is shared by at least three output channels;
generating a plurality of second neural networks respectively corresponding to each one of the at least three output channels;
training the first and second neural networks with the training data; and
outputting the distributions of the critical dimensions based on the at least three output channels;
wherein the method is performed by at least one computer system comprising at least one memory and at least one processor coupled to the memory.

22. The method according to claim 21, wherein the at least three output channels respectively comprise different parameters of the distributions of the critical dimensions, and wherein the different parameters comprise critical dimension mean, critical dimension variation, and critical dimension skewness.

23. The method according to claim 21, wherein the first neural network comprises a convolutional neural network, and each of the plurality of second neural networks comprises a fully connected neural network.

24. A method of modeling distributions of critical dimensions, comprising:
receiving as inputs a plurality of aerial images of respective portions of a physical design layout of a semiconductor wafer;
employing the plurality of aerial images as training data;
generating a first neural network which is shared by at least three parameters of the distributions of the critical dimensions, wherein the distributions are asymmetric;
generating a plurality of second neural networks respectively corresponding to each one of the at least three parameters;
training the first and second neural networks with the training data; and
outputting the distributions of the critical dimensions based on the at least three parameters;
wherein the method is performed by at least one computer system comprising at least one memory and at least one processor coupled to the memory.

25. The method according to claim 24, wherein the at least three parameters comprise critical dimension mean, critical dimension variation, and critical dimension skewness.

* * * * *